US012720790B2

(12) United States Patent
Hikosaka

(10) Patent No.: US 12,720,790 B2
(45) Date of Patent: Aug. 25, 2026

(54) NITRIDE SEMICONDUCTOR AND SEMICONDUCTOR DEVICE

(71) Applicant: KABUSHIKI KAISHA TOSHIBA, Tokyo (JP)

(72) Inventor: Toshiki Hikosaka, Kawasaki Kanagawa (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 389 days.

(21) Appl. No.: 18/358,592

(22) Filed: Jul. 25, 2023

(65) Prior Publication Data

US 2024/0162339 A1 May 16, 2024

(30) Foreign Application Priority Data

Nov. 8, 2022 (JP) ................................ 2022-178634

(51) Int. Cl.
*H10D 30/47* (2025.01)
*H10D 62/85* (2025.01)

(52) U.S. Cl.
CPC ....... *H10D 30/475* (2025.01); *H10D 62/8503* (2025.01)

(58) Field of Classification Search
None
See application file for complete search history.

(56) References Cited

U.S. PATENT DOCUMENTS 9,269,799 B2 2/2016 Ishiguro et al.
2010/0244098 A1 9/2010 Yokoyama
2013/0175543 A1 7/2013 Kiyama et al.
2014/0084300 A1 3/2014 Okamoto et al.
2014/0239308 A1 8/2014 Hallin et al.
2019/0020318 A1 1/2019 Ishiguro et al.
2021/0226016 A1 7/2021 Hikosaka et al.
(Continued)

FOREIGN PATENT DOCUMENTS

JP 2009-21362 A 1/2009
JP 2010-232297 A 10/2010
(Continued)

OTHER PUBLICATIONS

Japan Patent Office, Office Action in JP App. No. 2022-178634 (Jan. 28, 2026).

*Primary Examiner* — Jack S Chen
(74) *Attorney, Agent, or Firm* — Finnegan, Henderson, Farabow, Garrett & Dunner, LLP

(57) ABSTRACT

According to one embodiment, a nitride semiconductor includes a nitride member. The nitride member includes a first nitride region, and a second nitride region. The first nitride region includes $Al_{x1}Ga_{1-x1}N$ ($0 \leq x1 < 1$). The $Al_{x1}Ga_{1-x1}N$ includes a first element. The first element includes at least one selected from the group consisting of Fe and Mn. The second nitride region includes $Al_{x1}Ga_{1-x1}N$ ($0 \leq x1 < 1$). A direction from the first nitride region to the second nitride region is along a first direction. A second lattice length of the second nitride region in a first axis crossing the first direction is different from a first lattice length of the first nitride region in the first axis.

18 Claims, 7 Drawing Sheets

(56) References Cited

U.S. PATENT DOCUMENTS

| | | | | |
|---|---|---|---|---|
| 2024/0154004 | A1* | 5/2024 | Hikosaka ............. | H10D 30/475 |
| 2024/0162339 | A1* | 5/2024 | Hikosaka ........... | H10D 62/8503 |

FOREIGN PATENT DOCUMENTS

| | | | |
|---|---|---|---|
| JP | 2012-199398 | A | 10/2012 |
| JP | 2015-149488 | A | 8/2015 |
| JP | 2016-511545 | A | 4/2016 |
| JP | 2017-168862 | A | 9/2017 |
| JP | 2019-21704 | A | 2/2019 |
| JP | 2021-114548 | A | 8/2021 |

* cited by examiner

SP2

13 12 11

12p $1\times10^{19}$
$1\times10^{18}$
$1\times10^{17}$
$1\times10^{16}$
$1\times10^{15}$ C(Fe)($cm^{-3}$)

0 100 200 300 400 500 600 pZ(nm)

Z ←

NITRIDE SEMICONDUCTOR AND SEMICONDUCTOR DEVICE

CROSS-REFERENCE TO RELATED APPLICATIONS

This application is based upon and claims the benefit of priority from Japanese Patent Application No. 2022-178634, filed on Nov. 8, 2022; the entire contents of which are incorporated herein by reference.

FIELD

Embodiments of the invention generally relate to a nitride semiconductor and a semiconductor device.

BACKGROUND

For example, in semiconductor devices based on nitride semiconductors, improved characteristics are desired.

BRIEF DESCRIPTION OF THE DRAWINGS

FIGS. 2A and 2B are graphs illustrating nitride semiconductors;

DETAILED DESCRIPTION

Figure 1:
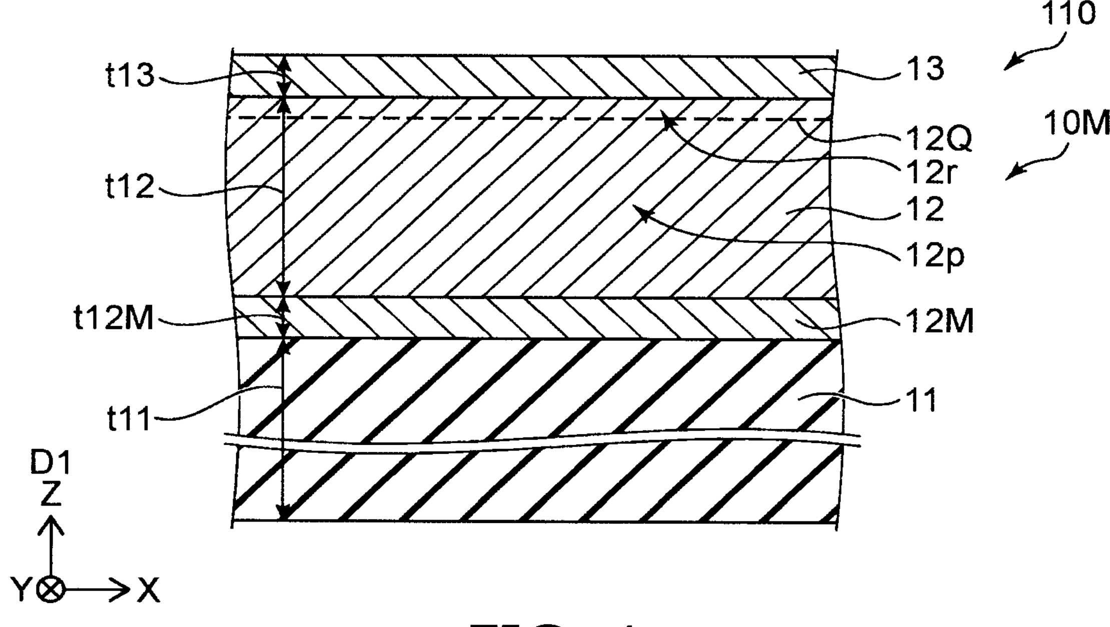
FIG. 1 is a schematic cross-sectional view illustrating a nitride semiconductor according to a first embodiment.

According to one embodiment, a nitride semiconductor includes a nitride member. The nitride member includes a first nitride region, and a second nitride region. The first nitride region includes $Al_{x1}Ga_{1-x1}N$ ($0 \leq x1 < 1$). The $Al_{x1}Ga_{1-x1}N$ includes a first element. The first element includes at least one selected from the group consisting of Fe and Mn. The second nitride region includes $Al_{x1}Ga_{1-x1}N$ ($0 \leq x1 < 1$). A direction from the first nitride region to the second nitride region is along a first direction. A second lattice length of the second nitride region in a first axis crossing the first direction is different from a first lattice length of the first nitride region in the first axis.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a nitride semiconductor according to the first embodiment.

As shown in FIG. 1, a nitride semiconductor 110 according to the embodiment includes a nitride member 10M.

The nitride member 10M includes a first nitride region 11 and a second nitride region 12. the nitride member 10M may further include an intermediate region 12M. The nitride member 10M is, for example, a crystal. The first nitride region 11, the second nitride region 12 and the intermediate region 12M are crystals, for example.

The first nitride region 11 includes $Al_{x1}Ga_{1-x1}N$ ($0 \leq x1 < 1$). The $Al_{x1}Ga_{1-x1}N$ includes a first element. The first element includes at least one selected from the group consisting of Fe and Mn.

The composition ratio x1 is, for example, not less than 0 and not more than 0.1. The $Al_{x1}Ga_{1-x1}N$ can be, for example, GaN. The first nitride region 11 may be, for example, GaN including the first element. The first nitride region 11 is, for example, Fe-doped GaN or Mn-doped GaN.

The second nitride region 12 includes $Al_{x1}Ga_{1-x1}N$ ($0 \leq x1 < 1$). A first concentration of the first element in the first nitride region 11 is higher than a second concentration of the first element in the second nitride region 12. Alternatively, the second nitride region 12 does not include the first element. The second nitride region 12 may be, for example, undoped GaN. The composition ratio in second nitride region 12 is substantially the same as the composition ratio in first nitride region 11.

A direction from the first nitride region 11 to the second nitride region 12 is along a first direction D1. The first direction D1 is defined as a Z-axis direction. One direction perpendicular to the Z-axis direction is defined as an X-axis direction. A direction perpendicular to the Z-axis direction and the X-axis direction is defined as a Y-axis direction. The first nitride region 11 and the second nitride region 12 extend substantially parallel to the X-Y plane.

In the embodiment, a second lattice length of the second nitride region 12 in a first axis crossing the first direction D1 is different from a first lattice length of the first nitride region 11 in the first axis. The first axis is, for example, the a-axis of the nitride member 10M. The first direction D1 is, for example, along the c-axis.

The lattice length is different between the first nitride region 11 and the second nitride region 12 having substantially the same composition ratio. Thereby, for example, the first element included in the first nitride region 11 can be suppressed from moving (for example, diffusing) toward the second nitride region 12 or a nitride region provided thereon.

In the embodiment, by providing first nitride region 11 including the first element, high electrical resistance is obtained in first nitride region 11. The first nitride region 11 is, for example, an insulating or semi-insulating base body. By using such first nitride region 11, a semiconductor device using nitride semiconductor 110 can operate stably. For example, current leakage is suppressed.

If the first nitride region 11 includes the first element, the first element may migrate (e.g., diffuse) into the second nitride region 12 or into the nitride region provided thereon. If the first element moves, it may become difficult to obtain desired characteristics in a semiconductor device using the nitride semiconductor 110. When the first element moves, for example, carrier mobility decreases. When the first element moves, for example, current collapse increases, making it difficult to obtain stable operation. The movement of the first element, for example, reduces reliability.

In the embodiment, as described above, the lattice lengths of the first nitride region 11 and the second nitride region 12 are different from each other. For example, it is possible to suppress the first element included in the first nitride region 11 from migrating (e.g., diffusing) toward the second nitride region 12 or the nitride region provided thereon. Even if the first nitride region 11 includes the first element, a low concentration of the first element is obtained in the second nitride region 12 or in the nitride regions thereon. According to the embodiment, it is possible to provide a nitride semiconductor capable of improving characteristics. According to the embodiments, for example, a nitride semiconductor capable of achieving high carrier mobility can be provided.

Between the first nitride region 11 and the second nitride region 12 having different lattice lengths, a relaxation region may be provided in which the change in lattice length is relaxed. By providing the relaxation region, even when the first nitride region 11 includes the first element, a low concentration of the first element can be obtained in the second nitride region 12 or the nitride region thereon. It is believed that the first element is trapped in this relaxation region. For example, crystal defects are formed in the relaxation region. It is considered that the crystal defects function as traps for the first element. It is considered that this suppresses the movement of the first element included in the first nitride region 11 toward the second nitride region 12.

As shown in FIG. 1, the nitride member 10M may further include intermediate region 12M. The intermediate region 12M is provided between the first nitride region 11 and the second nitride region 12. For example, the intermediate region 12M includes crystal defects. The intermediate region 12M functions as a relaxation region described above. The intermediate region 12M may contact first nitride region 11. The intermediate region 12M may contact second nitride region 12.

The intermediate region 12M may include $Al_{z1}Ga_{1-z1}N$ ($0 \le z1 < 1$). The composition ratio in the intermediate region 12M may be substantially the same as the composition ratio in the first nitride region 11 and the composition ratio in the second nitride region 12.

For example, a ratio of the absolute value of the difference between the composition ratio z1 and the composition ratio x1 to the composition ratio x1 may be 0.7 or less. Such an intermediate region 12M (for example, a relaxed region) can be easily obtained by controlling conditions such as formation temperature. For example, by crystalline growth at a relatively low temperature (350° C. to 430° C.), the formation of the intermediate region 12M serving as the relaxation region becomes easily to be formed. For example, it becomes easier to form the intermediate region 12M including crystal defects.

As shown in FIG. 1, in this example, the nitride member 10M further includes a third nitride region 13. The third nitride region 13 includes $Al_{x3}Ga_{1-x3}N$ ($0 < x3 \le 1$, $x1 < x3$). In the $Al_{x3}Ga_{1-x3}N$, for example, the composition ratio x3 is not less than 0.05 and not more than 1. The composition ratio x3 may be not less than 0.15 and not more than 0.3. The third nitride region 13 is, for example, AlGaN.

The second nitride region 12 is located between the first nitride region 11 and the third nitride region 13. The second nitride region 12 may contact the third nitride region 13. As shown in FIG. 1, the second nitride region 12 includes a region facing third nitride region 13. A carrier region 12Q may be formed in this region. The carrier region 12Q is, for example, a two-dimensional electron gas. In the operation of a semiconductor device using nitride semiconductor 110, carrier region 12Q is used.

Figure 2B:
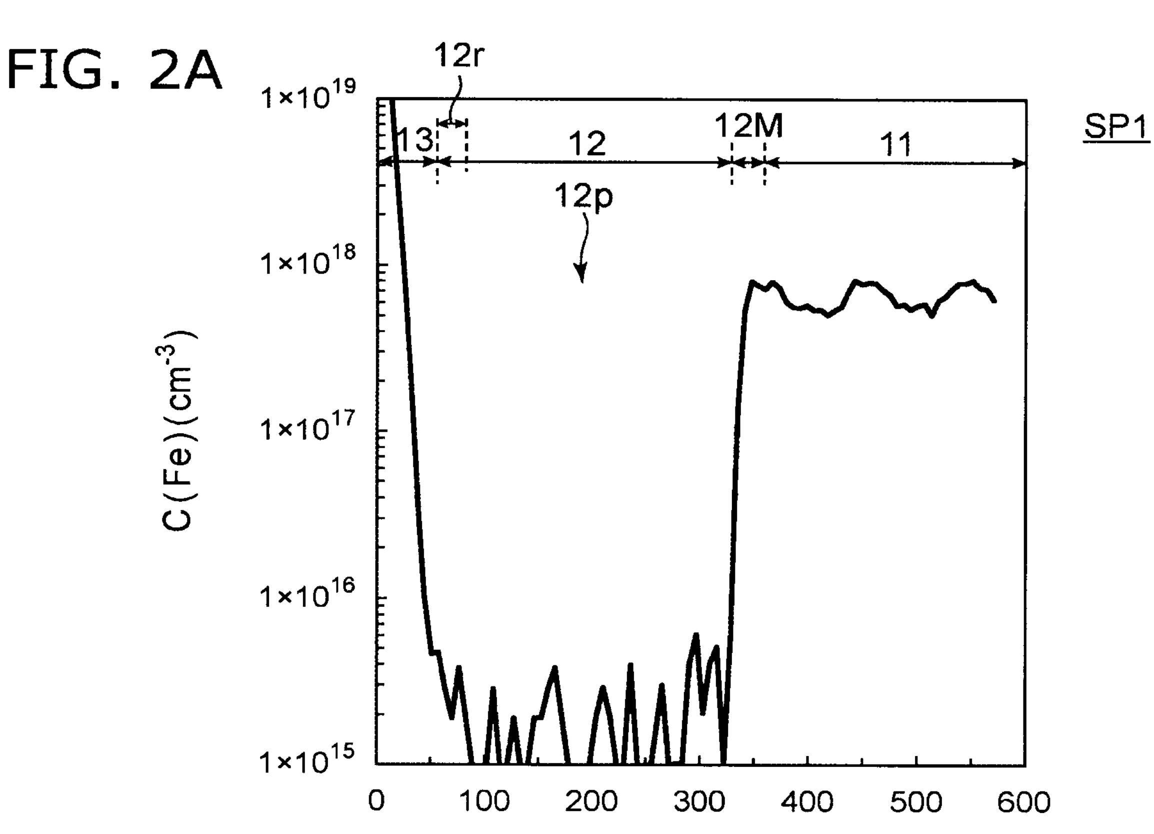

FIGS. 2A and 2B are graphs illustrating nitride semiconductors.

FIG. 2A corresponds to a first sample SP1. FIG. 2B corresponds to a second sample SP2. These figures are examples of SIMS (Secondary Ion Mass Spectrometry) analysis results. The first sample SP1 is obtained by forming the second nitride region 12 on the first nitride region 11 and a third nitride region 13 on the second nitride region 12. These regions are formed by epitaxial growth. In the first sample SP1, by crystal growth at a relatively low temperature being followed by crystal growth at a high temperature on the first nitride region 11, the intermediate region 12M and the second nitride region 12 are obtained. In the second sample SP2, crystal growth at the relatively low temperature is not performed, and the second nitride region 12 is formed by crystal growth at a high temperature.

FIGS. 2A and 2B show the profile of the first element in the nitride member 10M in the Z-axis direction. In this example, the first element is Fe. The horizontal axis of these figures is the position pZ in the Z-axis direction. The vertical axis is the concentration (C(Fe)) of Fe.

As shown in FIG. 2A, in the first sample SP1, the first nitride region 11 includes Fe (first element) at a high concentration. In the intermediate region 12M, the concentration of Fe decreases rapidly. In the intermediate region 12M, the migration (e.g., diffusion) of Fe from the first nitride region 11 to the second nitride region 12 is suppressed. In the second nitride region 12, the concentration of Fe is, for example, $5 \times 10^{15}$ $cm^{-3}$ or less. The second nitride region 12 substantially does not Fe.

As shown in FIG. 2B, in the second sample SP2, the second nitride region 12 also includes Fe at a high concentration.

It was found that the characteristics of carrier mobility are different between the first sample SP1 and the second sample SP2. The carrier mobility is evaluated by Hall effect measurement in the first sample SP1 and the second sample SP2. In the first sample SP1, a high mobility of 1830 $cm^2/Vs$ is obtained. In the second sample SP2, the mobility is as low as 1650 $cm^2/Vs$. As described above, a low concentration of the first element in the second nitride region 12 results in a high carrier mobility.

As shown in FIGS. 1 and 2A, the second nitride region 12 includes a contact region 12*r* contacting the third nitride region 13. The thickness of the contact region 12*r* in the first direction D1 is, for example, 1/10 of the thickness of the second nitride region 12 in the first direction D1. The concentration of the first element (for example, Fe) in the contact region 12*r* is, for example, 1/20 or less of the concentration of the first element in the first nitride region 11.

It was found that the first sample SP1 and the second sample SP2 have different lattice length characteristics. In the first sample SP1, a second lattice length of the second nitride region 12 along the first axis is different from a first lattice length of the first nitride region 11 along the first axis. In the second sample SP2, the second lattice length of the second nitride region 12 along the first axis is substantially the same as the first lattice length of the first nitride region 11 along the first axis. Information about the lattice length can be obtained, for example, based on reciprocal lattice spatial mapping of X-ray diffraction properties.

Figure 3:
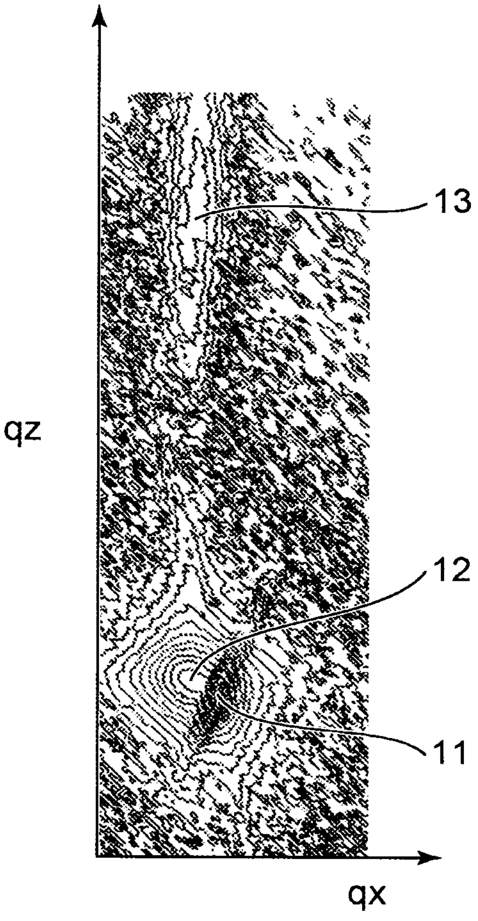
FIG. 3 is a graph illustrating characteristics of the nitride semiconductor.

FIG. 3 is a graph illustrating characteristics of the nitride semiconductor.

FIG. 3 is a reciprocal lattice space mapping diagram. FIG. 3 is a reciprocal space mapping diagram of the (10-14) asymmetric reflection of the first sample SP1. The horizontal axis of FIG. 3 is the reciprocal qx of the lattice length in the <20-20> direction. The vertical axis is the reciprocal qz of the lattice length in the <0004> direction. The horizontal axis of FIG. 3 is, for example, the reciprocal qx of the lattice length along the X-axis direction. The vertical axis of FIG. 3 is, for example, the reciprocal qz of the lattice length along the Z-axis direction. In FIG. 3, the left direction of the horizontal axis corresponds to the long lattice length along the X-axis direction. In FIG. 3, the downward direction of the vertical axis corresponds to the long lattice length along the Z-axis direction. FIG. 3 shows a measurement results of the lattices of the first nitride region 11, the second nitride region 12, and the third nitride region 13.

As shown in FIG. 3, the lattice length in the X-axis direction in the second nitride region 12 is longer than the lattice length in the X-axis direction in the first nitride region 11 (left in FIG. 3). Thus, in the first sample SP1, there is a difference in the lattice length.

The lattice length is measured for various samples prepared by changing the formation conditions of the nitride member 10M. In various samples, the concentration of the first element (Fe) in the second nitride region 12 is measured.

Figure 4:
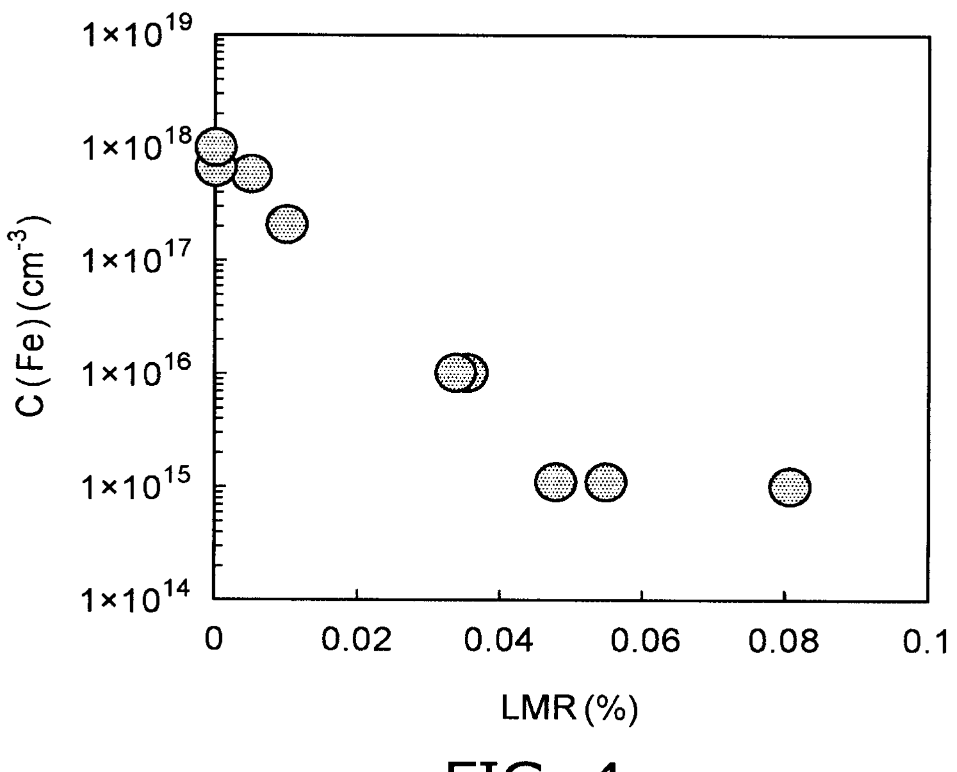
FIG. 4 is a graph illustrating characteristics of nitride semiconductors.

FIG. 4 is a graph illustrating characteristics of nitride semiconductors.

The horizontal axis of FIG. 4 is a lattice length difference ratio LMR. The lattice length difference ratio LMR is a ratio of the absolute value of the difference between the second lattice length and the first lattice length to the first lattice length. As described above, the first lattice length is the lattice length of the first nitride region 11 in the first axis (e.g., the a-axis) crossing the first direction D1. The second lattice length is the lattice length of the second nitride region 12 in the first axis. In the first sample SP1, the lattice length difference ratio LMR is 0.08%. In the second sample SP2, the lattice length difference ratio LMR is 0%.

The vertical axis of FIG. 4 is the concentration (C(Fe)) of Fe in the second nitride region 12. In this example, the concentration (C(Fe)) is the concentration of Fe at a middle position 12*p* (see FIGS. 2A and 2B) in the first direction D1 (thickness direction) of the second nitride region 12.

As shown in FIG. 4, when the lattice length difference ratio LMR increases, the concentration of Fe (C (Fe)) in the second nitride region 12 decreases. It is considered that by a large difference between the second lattice length and the first lattice length, the trapping effect of the first element (for example, Fe) in the relaxation region (for example, the intermediate region 12M) becomes high.

In the embodiment, the lattice length difference ratio LMR may be 0.01% or more. Thereby, the concentration of Fe can be reduced in the second nitride region 12. The lattice length difference ratio LMR may be 0.035% or more. The concentration of Fe can be further reduced in the second nitride region 12.

In the embodiment, the lattice length difference ratio LMR may be 0.5% or less. Thereby, the density of crystal defects (dislocations, for example) can be reduced in the second nitride region 12. The lattice length difference ratio LMR may be 0.25% or less. The density of crystal defects can be further reduced in the second nitride region 12.

In the embodiments, for example, the second lattice length is longer than the first lattice length. In the embodiments, the second lattice length may be shorter than the first lattice length. The discontinuous region due to the difference in lattice length functions as a trap for the first element. Even when the second lattice length is shorter than the first lattice length, the concentration of the first element in the second nitride region 12 can be reduced.

The concentration of the first element in the second nitride region 12 (second concentration) is 1/50 or less of the concentration of the first element in the first nitride region 11 (first concentration).

The concentration of the first element in the first nitride region 11 (first concentration) is higher than the concentration of the first element at the middle position 12*p* of the second nitride region 12 in the first direction D1 (middle position concentration). Alternatively, the middle position 12*p* does not include the first element. The middle position concentration is, for example, 1/50 or less of the first concentration.

The first concentration is, for example, $1\times10^{17}$ $cm^{-3}$ or more. Thereby, sufficient insulation is obtained in the first nitride region 11. The second concentration is, for example, less than $1\times10^{17}$ $cm^{-3}$. The second concentration may be, for example, $5\times10^{15}$ $cm^{-3}$ or less. The second concentration may be, for example, 1/100 or less of the first concentration. The concentration of the first element (for example, Fe) at the middle position 12*p* may be 1/100 or less of the first concentration. The second concentration may be, for example, 1/10 or less of the first concentration. The concentration of the first element (for example, Fe) at the middle position 12*p* may be 1/10 or less of the first concentration.

As shown in FIG. 1, a thickness of the intermediate region 12M along the first direction D1 is defined as an intermediate region thickness t12M. It was found that the lattice length difference ratio LMR changes by changing the intermediate region thickness t12M.

Figure 5:
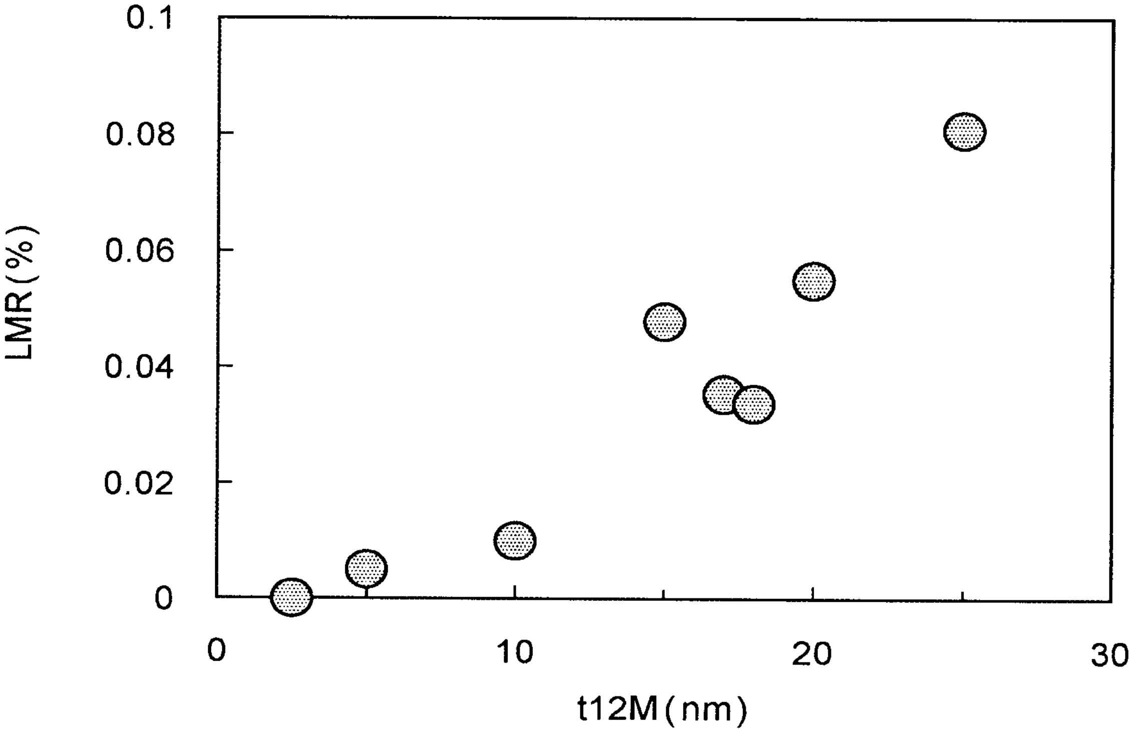
FIG. 5 is a graph illustrating characteristics of nitride semiconductors.

FIG. 5 is a graph illustrating characteristics of nitride semiconductors.

The horizontal axis of FIG. 5 is the thickness of the intermediate region 12M (intermediate region thickness t12M). The vertical axis is the lattice length difference ratio LMR. As shown in FIG. 5, as the intermediate region thickness t12M increases, the lattice length difference ratio LMR increases. It is considered that the lattice relaxes more easily as the intermediate region thickness t12M increases.

In embodiments, the intermediate region thickness t12M is, for example, 10 nm or more. A high lattice length difference ratio LMR is easily obtained. Thereby, the concentration of the first element in the second nitride region 12 can be lowered. The intermediate region thickness t12M may be 15 nm or more. The concentration of the first element in the second nitride region 12 can be further lowered.

The intermediate region thickness t12M is, for example, 50 nm or less. It becomes easy to obtain the second nitride region 12 having high crystal quality. The intermediate region thickness t12M may be 25 nm or less. The concentration of the first element in the second nitride region 12 can be further lowered. Crystal quality in the second nitride region 12 can be further increased.

As shown in FIG. 1, a thickness of the first nitride region 11 along the first direction D1 is defined as a first nitride region thickness t11. The first nitride region thickness t11 is, for example, not less than 10 μm and not more than 1000 μm. For example, the first nitride region 11 is a substrate including $Al_{x1}Ga_{1-x1}N$ ($0\leq x1<1$). For example, the $Al_{x1}Ga_{1-x1}N$ includes at least one selected from the group consisting of Fe and Mn. When the first nitride region thickness t11 is 10 μm or more, current leakage is easily suppressed. A semiconductor device using the nitride semiconductor 110 is easily to operate stably. When the first nitride region thickness t11 is thicker than 1000 μm, malfunction due to defects is likely to occur.

As shown in FIG. 1, a thickness of the second nitride region 12 along the first direction D1 is defined as a second nitride region thickness t12. The second nitride region thickness t12 is, for example, not less than 10 nm and not more than 1000 nm. When the second nitride region thickness t12 is less than 10 nm, the crystal quality tends to deteriorate in the second nitride region 12 or the nitride region thereon. When the second nitride region thickness t12 is thicker than 1000 nm, the electrical resistance of the second nitride region 12 is low, and current leakage is likely to occur.

As shown in FIG. 1, a thickness of the third nitride region 13 along the first direction D1 is defined as a third nitride region thickness t13. The third nitride region thickness t13 is, for example, not less than 10 nm and not more than 50 nm. When the third nitride region thickness t13 is less than 10 nm, the carrier region 12Q is difficult to be formed. The mobility tends to decrease. When the third nitride region thickness t13 is thicker than 50 nm, defects tend to increase at the third nitride region thickness t13. The mobility tends to decrease.

When the first element is Mn, by providing a difference in lattice length between the first nitride region 11 and the second nitride region 12, movement (e.g., diffusion) of Mn (the first element) to the second nitride region 12 can be also suppressed. When the first element is Mn, the concentration of Mn in the second nitride region 12 also decreases as the lattice length difference ratio LMR increases. It is considered that the larger the difference in the lattice length, the higher the trapping effect of Mn (first element) in the relaxation region (for example, the intermediate region 12M).

In a third sample, the first nitride region 11 includes Mn (first element) at a high concentration. In the third sample, the concentration of Mn sharply decreases in the intermediate region 12M. In the third sample, the second nitride region 12 substantially does not include Mn. On the other hand, in a fourth sample, the second nitride region 12 also includes Mn at a high concentration.

The characteristics of carrier mobility are different between the third sample and the fourth sample. In the third sample SP3 and the fourth sample SP4, carrier mobility is evaluated by Hall effect measurement. A high mobility of 1850 $cm^2/Vs$ is obtained for the third sample. In the fourth sample, the mobility is as low as 1600 $cm^2/Vs$. Thus, by the low concentration of the first element in the second nitride region 12, high carrier mobility can be obtained.

Figure 6:
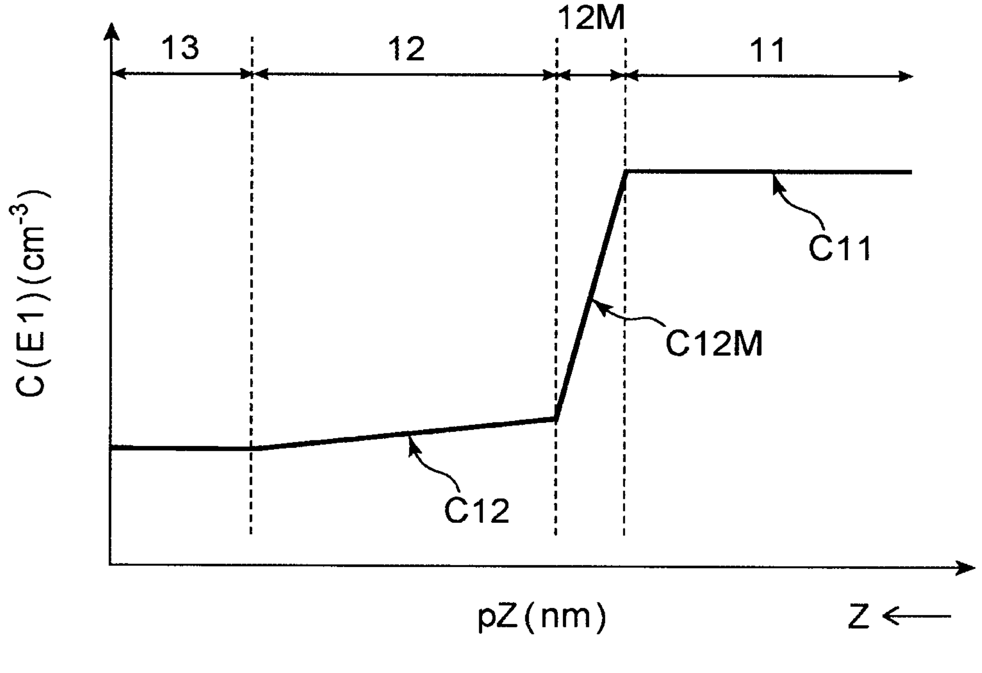
FIG. 6 is a graph illustrating the nitride semiconductors according to the first embodiment.

FIG. 6 is a graph illustrating the nitride semiconductors according to the first embodiment.

The horizontal axis of FIG. 6 is the position pZ in the Z-axis direction. The vertical axis is the logarithm of the concentration (C(E1)) of the first element.

As shown in FIG. 6, an intermediate concentration C12M of the first element in the intermediate region 12M decreases along the first orientation from the first nitride region 11 to the second nitride region 12. The second concentration C12 of the first element in the second nitride region 12 decreases along the first orientation from the first nitride region 11 to the second nitride region 12. The first concentration C11 of the first element in the first nitride region 11 may decrease along the first orientation from the first nitride region 11 to the second nitride region 12.

A rate of change of the intermediate concentration C12M with respect to the position pZ along the first orientation is higher than a rate of change of the first concentration C11 with respect to the position pZ. For example, a rate of change of a logarithm of the intermediate concentration C12M with respect to the position pZ along the first orientation is higher than a rate of change of a logarithm of the first concentration C11 with respect to the position pZ. As already explained, the first concentration C11 is the concentration of the first element in the first nitride region 11.

The rate of change of the intermediate concentration C12M with respect to the change of the position pZ along the first orientation is higher than a rate of change of the second concentration C12 with respect to the change of the position pZ. For example, the rate of change of the logarithm of the intermediate concentration C12M to the change of the position pZ along the first orientation is higher than a rate of change of a logarithm of the second concentration C12 to the change of the position pZ. As described above, the second concentration C12 is the concentration of the first element in the second nitride region 12.

The rate of change of the second concentration C12 with respect to the change of the position pZ along the first orientation is higher than the rate of change of the first concentration C11 with respect to the change of the position pZ. For example, the rate of change of the logarithm of the second concentration C12 to the change of the position pZ along the first orientation is higher than the rate of change of the logarithm of the first concentration C11 to the change of the position pZ.

In the intermediate region 12M, the concentration of the first element rapidly decreases. In the second nitride region 12, a low concentration of the first element is obtained.

Figure 7:
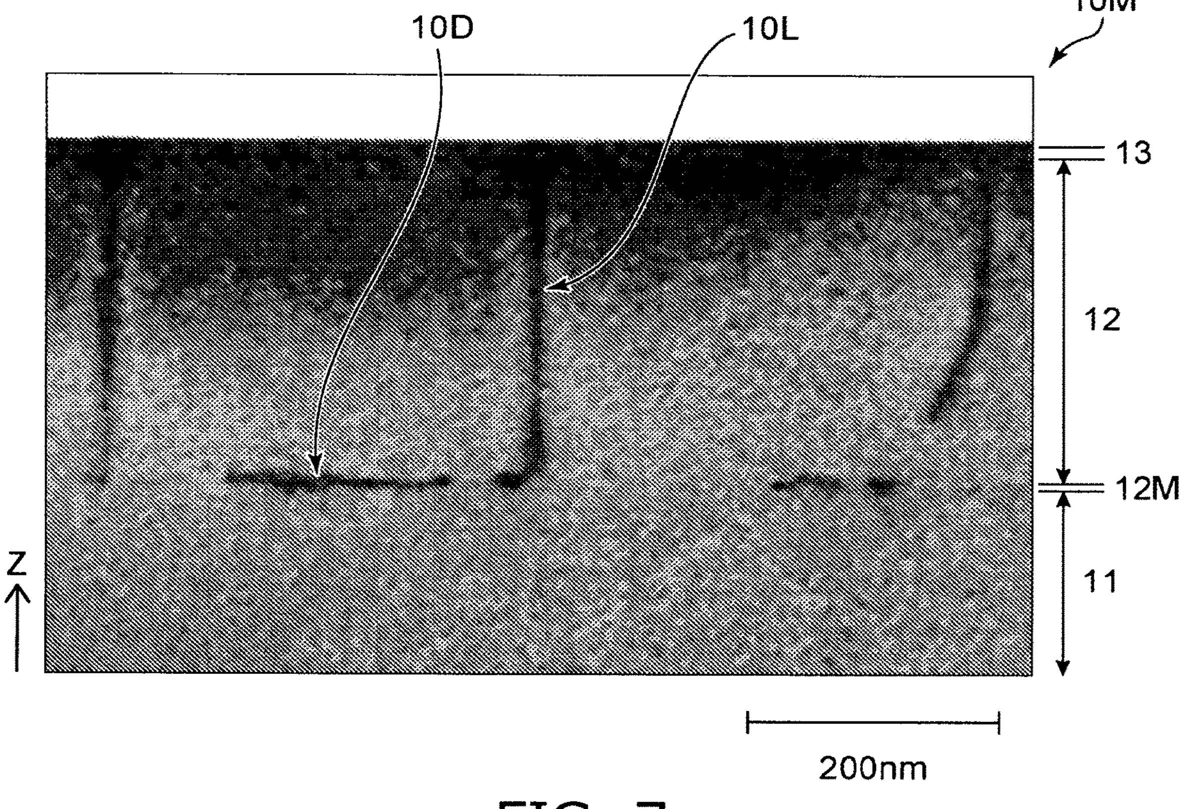
FIG. 7 is an electron micrograph image illustrating the nitride semiconductor according to the first embodiment.

FIG. 7 is an electron micrograph image illustrating the nitride semiconductor according to the first embodiment.

FIG. 7 is a TEM (Transmission Electron Microscopy) image of the first sample SP1. As shown in FIG. 7, a crystal defect 10D exists in the intermediate region 12M. It is considered that the difference in lattice length between the first nitride region 11 and the second nitride region 12 changes due to the crystal defect 10D.

As shown in FIG. 7, dislocations 10L may exist in the second nitride region 12. The density of dislocations 10L in second nitride region 12 may be higher than the density of dislocations 10L in first nitride region 11. This tends to increase the difference in lattice length between the first nitride region 11 and the second nitride region 12. A low concentration of the first element is likely to be obtained in the second nitride region 12.

Second Embodiment

The second embodiment relates to a semiconductor device.

Figure 8:
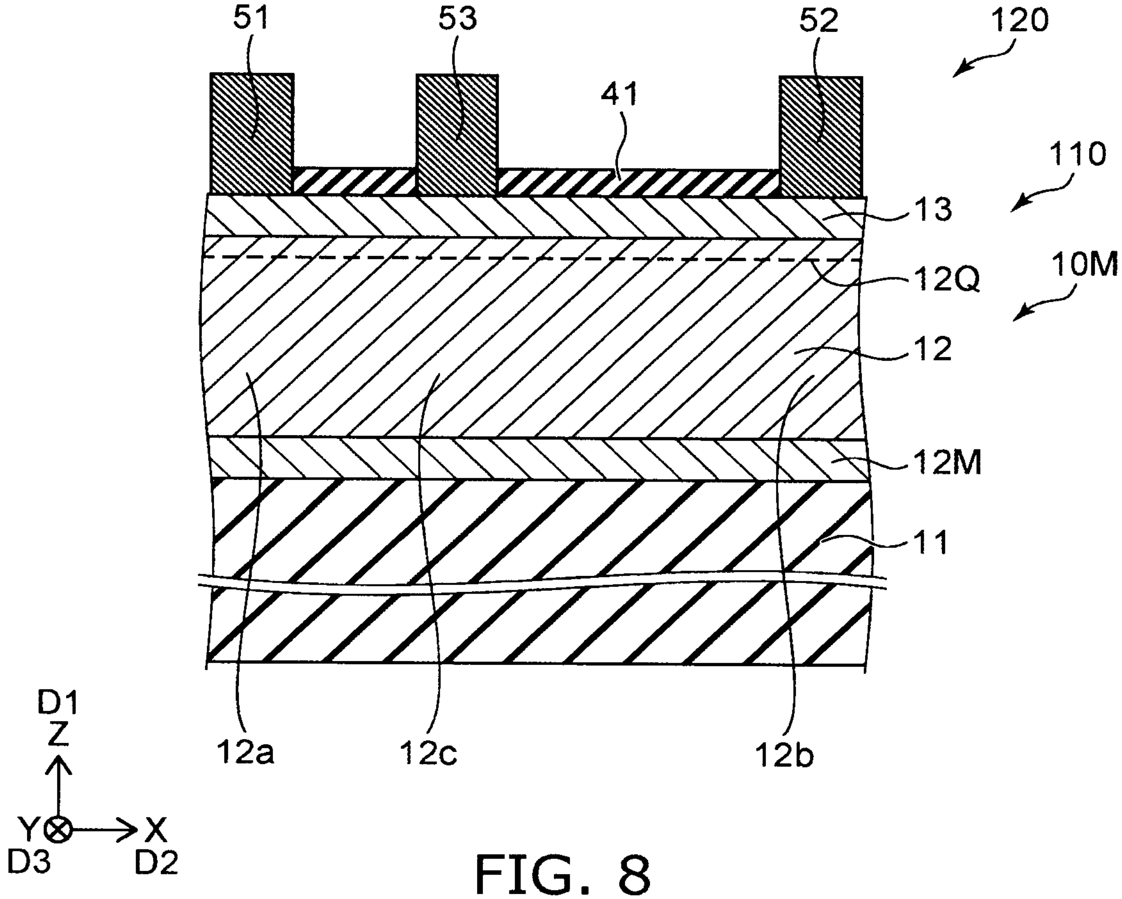
FIG. 8 is a schematic cross-sectional view illustrating the semiconductor device according to a second embodiment.

FIG. 8 is a schematic cross-sectional view illustrating the semiconductor device according to the second embodiment.

As shown in FIG. 8, a semiconductor device 120 according to the embodiment includes the nitride semiconductor 110 according to the first embodiment, a first electrode 51, a second electrode 52, and a third electrode 53.

A direction from the first electrode 51 to the second electrode 52 is along a second direction D2. The second direction D2 crosses the first direction D1.

A position of the third electrode 53 in the second direction D2 is between a position of the first electrode 51 in the second direction D2 and a position of the second electrode 52 in the second direction D2. The second nitride region 12 includes a first partial region 12*a*, a second partial region 12*b*, and a third partial region 12*c*. A direction from the first partial region 12*a* to the first electrode 51 is along the first direction D1. A direction from the second partial region 12*b* to the second electrode 52 is along the first direction D1. The third partial region 12*c* is located between the first partial region 12*a* and the second partial region 12*b* in the second direction D2. A direction from the third partial region 12*c* to the third electrode 53 is along the first direction D1.

The first electrode 51 is electrically connected to a portion of the third nitride region 13. The second electrode 52 is electrically connected to another portion of the third nitride region 13. The first electrode 51, the second electrode 52, and the third electrode 53 may extend along a third direction D3, for example. The third direction D3 crosses a plane including the first direction D1 and the second direction D2. The third direction D3 is, for example, the Y-axis direction.

In the semiconductor device 120, a current flowing between the first electrode 51 and the second electrode 52 can be controlled by a potential of the third electrode 53. The potential of the third electrode 53 is, for example, a potential based on a potential of the first electrode 51. The first electrode 51 functions, for example, as a source electrode. The second electrode 52 functions, for example, as a drain electrode. The third electrode 53 functions, for example, as a gate electrode. The semiconductor device 120 is, for example, a HEMT (High Electron Mobility Transistor). The semiconductor device 120 is, for example, a high frequency transistor.

As shown in FIG. 8, a first insulating member 41 may be provided. The third nitride region 13 is provided between the second nitride region 12 and the first insulating member 41.

In this example, the third electrode 53 contacts the third nitride region 13. High-speed switching characteristics can be obtained. The first insulating member 41 may be provided between the third electrode 53 and the third nitride region 13.

According to the embodiments, the low concentration of the first element is obtained in the second nitride region 12. For example, high carrier mobility can be obtained. According to the embodiment, defects can be suppressed. For example, defects caused by the first element can be suppressed. For example, pits can be suppressed. Thereby, for example, current leakage can be suppressed. According to the embodiments, it is possible to provide a semiconductor device whose characteristics can be improved.

The semiconductor device 120 can obtain, for example, high carrier mobility. For example, current collapse can be suppressed. High reliability is obtained.

In the embodiment, information about the shape of the nitride region and the like can be obtained by, for example, electron microscopic observation. Information about the composition and element concentration in the nitride region can be obtained, for example, by EDX (Energy Dispersive X-ray Spectroscopy) or SIMS. Information about the composition in nitride regions may be obtained, for example, by X-ray reciprocal space mapping or photoluminescence.

Embodiments may include the following configurations (for example, technical proposals).

Configuration 1

A nitride semiconductor, comprising:

a nitride member, the nitride member including:

a first nitride region including $Al_{x1}Ga_{1-x1}N$ ($0 \leq x1 < 1$), the $Al_{x1}Ga_{1-x1}N$ including a first element, the first element including at least one selected from the group consisting of Fe and Mn; and a second nitride region including $Al_{x1}Ga_{1-x1}N$ ($0 \leq x1 < 1$), a direction from the first nitride region to the second nitride region being along a first direction, a second lattice length of the second nitride region in a first axis crossing the first direction being different from a first lattice length of the first nitride region in the first axis.

Configuration 2

The nitride semiconductor according to Configuration 1, wherein a lattice length difference ratio of an absolute value of a difference between the second lattice length and the first lattice length to the first lattice length is 0.01% or more.

Configuration 3

The nitride semiconductor according to Configuration 2, wherein the lattice length difference ratio is 0.035% or more.

Configuration 4

The nitride semiconductor according to any one of Configurations 1-3, wherein, the second lattice length is longer than the first lattice length.

Configuration 5

The nitride semiconductor according to any one of Configurations 1-4, wherein a first concentration of the first element in the first nitride region is higher than a second concentration of the first element in the second nitride region, or the second nitride region does not include the first element.

Configuration 6

The nitride semiconductor according to Configuration 5, wherein the second concentration is 1/10 or less of the first concentration.

Configuration 7

The nitride semiconductor according to any one of Configurations 1-4, wherein a first concentration of the first element in the first nitride region is higher than an intermediate concentration of the first element at an intermediate position in the first direction of the second nitride region, or the intermediate position does not include the first element.

Configuration 8

The nitride semiconductor according to Configuration 7, wherein the intermediate concentration is 1/10 or less of the first concentration.

Configuration 9

The nitride semiconductor according to any one of Configurations 5-8, wherein the first concentration is $1 \times 10^{17}$ $cm^{-3}$ or more.

Configuration 10

The nitride semiconductor according to any one of Configurations 1-9, wherein a first nitride region thickness of the first nitride region along the first direction is not less than 10 μm and not more than 1000 μm.

Configuration 11

The nitride semiconductor according to Configuration 5, wherein the nitride member further includes an intermediate region provided between the first nitride region and the second nitride region, and the intermediate region includes crystal defects.

Configuration 12

The nitride semiconductor according to Configuration 11, wherein a thickness of the intermediate region along the first direction is not less than 10 nm and not more than 50 nm.

Configuration 13

The nitride semiconductor according to Configurations 11 or 12, wherein a density of dislocations in the second nitride region is higher than a density of dislocations in the first nitride region.

Configuration 14

The nitride semiconductor according to any one of Configurations 11-13, wherein the intermediate region includes $Al_{z1}Ga_{1-z1}N$ ($0 \leq z1 < 1$).

Configuration 15

The nitride semiconductor according to Configuration 14, wherein a ratio of an absolute value of a difference between the z1 and the x1 to the x1 is 0.7 or less.

Configuration 16

The nitride semiconductor according to any one of Configurations 11-15, wherein an intermediate concentration of the first element in the intermediate region decreases along a first orientation from the first nitride region to the second nitride region, and a rate of a change of the intermediate concentration with respect to a change of a position along the first orientation is higher than a rate of a change of the first concentration with respect to the change of the position and higher than a rate of a change of the second concentration with respect to the change of the position.

Configuration 17

The nitride semiconductor according to any one of Configurations 1-16, wherein the x1 is not less than 0 and not more than 0.1.

Configuration 18

A nitride semiconductor, comprising:

a nitride member, the nitride member including:

a first nitride region including $Al_{x1}Ga_{1-x1}N$ ($0 \leq x1 < 1$), the $Al_{x1}Ga_{1-x1}N$ including a first element, the first element including at least one selected from the group consisting of Fe and Mn;

a second nitride region including $Al_{x1}Ga_{1-x1}N$ ($0 \leq x1 < 1$), a direction from the first nitride region to the second nitride region being along a first direction; and an intermediate region provided between the first nitride region and the second nitride region, the intermediate region including $Al_{z1}Ga_{1-z1}N$ ($0 \leq z1 < 1$), a first concentration of the first element in the first nitride region being higher than a second concentration of the first element in the second nitride region, an intermediate concentration of the first element in the intermediate region decreasing along a first orientation from the first nitride region to the second nitride region, and a rate of a change of the intermediate concentration with respect to a change of a position along the first orientation being higher than a rate of a change of the first concentration with respect to the change of the position and higher than a rate of a change of the second concentration with respect to the change of the position.

Configuration 19

The nitride semiconductor according to any one of Configurations 1-18, wherein the nitride member further includes a third nitride region including $Al_{x3}Ga_{1-x3}N$ ($0 < x3 \leq 1$, $x1 < x3$), and the second nitride region is located between the first nitride region and the third nitride region.

Configuration 20

A semiconductor device, comprising:

the nitride semiconductor according to Configuration 19;

a first electrode;

a second electrode; and a third electrode, a direction from the first electrode to the second electrode being along a second direction crossing the first direction, a position of the third electrode in the second direction being between a position of the first electrode in the second direction and a position of the second electrode in the second direction, the second nitride region including a first partial region, a second partial region, and a third partial region, a direction from the first partial region to the first electrode being along the first direction, a direction from the second partial region to the second electrode being along the first direction, the third partial region being located between the first partial region and the second partial region in the second direction, and a direction from the third partial region to the third electrode being along the first direction, the first electrode being electrically connected to a portion of the third nitride region, and the second electrode being electrically connected to another portion of the third nitride region.

Configuration 21

The semiconductor device according to Configuration 20, wherein the third electrode contacts the third nitride region.

According to the embodiments, it is possible to provide a nitride semiconductor and a semiconductor device capable of improving characteristics.

In the specification of the present application, "electrically connected state" includes a state in which a plurality of conductors are physically in contact with each other and current flows between the plurality of conductors. "Electrically connected state" includes a state in which another conductor is inserted between a plurality of conductors and current flows between the plurality of conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductors such as nitride regions, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors and semiconductor devices practicable by an appropriate design modification by one skilled in the art based on the nitride semiconductors and semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:

a nitride member, the nitride member including:

a first nitride region including $Al_{x1}Ga_{1-x1}N$ ($0 \le x1 < 1$), the $Al_{x1}Ga_{1-x1}N$ including a first element, the first element including at least one selected from the group consisting of Fe and Mn; and a second nitride region including $Al_{x1}Ga_{1-x1}N$ ($0 \le x1 < 1$), a direction from the first nitride region to the second nitride region being along a first direction, a second lattice length of the second nitride region in a first axis crossing the first direction being different from a first lattice length of the first nitride region in the first axis.

2. The nitride semiconductor according to claim 1, wherein a lattice length difference ratio of an absolute value of a difference between the second lattice length and the first lattice length to the first lattice length is 0.01% or more.

3. The nitride semiconductor according to claim 2, wherein the lattice length difference ratio is 0.035% or more.

4. The nitride semiconductor according to claim 1, wherein, the second lattice length is longer than the first lattice length.

5. The nitride semiconductor according claim 1, wherein a first concentration of the first element in the first nitride region is higher than a second concentration of the first element in the second nitride region, or the second nitride region does not include the first element.

6. The nitride semiconductor according to claim 5, wherein the second concentration is 1/10 or less of the first concentration.

7. The nitride semiconductor according to claim 5, wherein the first concentration is $1 \times 10^{17}$ $cm^{-3}$ or more.

8. The nitride semiconductor according to claim 5, wherein the nitride member further includes an intermediate region provided between the first nitride region and the second nitride region, and the intermediate region includes crystal defects.

9. The nitride semiconductor according to claim 8, wherein a thickness of the intermediate region along the first direction is not less than 10 nm and not more than 50 nm.

10. The nitride semiconductor according to claim 8, wherein a density of dislocations in the second nitride region is higher than a density of dislocations in the first nitride region.

11. The nitride semiconductor according to claim 8, wherein the intermediate region includes $Al_{z1}Ga_{1-z1}N$ ($0 \le z1 < 1$).

12. The nitride semiconductor according to claim 11, wherein a ratio of an absolute value of a difference between the z1 and the x1 to the x1 is 0.7 or less.

13. The nitride semiconductor according to claim 8, wherein an intermediate concentration of the first element in the intermediate region decreases along a first orientation from the first nitride region to the second nitride region, and a rate of a change of the intermediate concentration with respect to a change of a position along the first orientation is higher than a rate of a change of the first concentration with respect to the change of the position and higher than a rate of a change of the second concentration with respect to the change of the position.

14. The nitride semiconductor according to claim 1, wherein a first concentration of the first element in the first nitride region is higher than an intermediate concentration of the first element at an intermediate position in the first direction of the second nitride region, or the intermediate position does not include the first element.

15. The nitride semiconductor according to claim 14, wherein the intermediate concentration is 1/10 or less of the first concentration.

16. The nitride semiconductor according to claim 1, wherein a first nitride region thickness of the first nitride region along the first direction is not less than 10 μm and not more than 1000 μm.

17. The nitride semiconductor according to claim 1, wherein the x1 is not less than 0 and not more than 0.1.

18. The nitride semiconductor according to claim 1, wherein the nitride member further includes a third nitride region including $Al_{x3}Ga_{1-x3}N$ ($0 < x3 \le 1$, $x1 < x3$), and the second nitride region is located between the first nitride region and the third nitride region.

* * * * *